(12) United States Patent     (10) Patent No.: US 8,174,014 B2
Pain     (45) Date of Patent: May 8, 2012

(54) APPARATUS AND METHOD OF MANUFACTURE FOR DEPOSITING A COMPOSITE ANTI-REFLECTION LAYER ON A SILICON SURFACE

(75) Inventor: Bedabrata Pain, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 12/632,583

(22) Filed: Dec. 7, 2009

(65) Prior Publication Data

US 2011/0018079 A1    Jan. 27, 2011

Related U.S. Application Data

(63) Continuation-in-part of application No. 11/674,608, filed on Feb. 13, 2007.

(60) Provisional application No. 60/774,123, filed on Feb. 16, 2006.

(51) Int. Cl.
*H01L 29/04* (2006.01)

(52) U.S. Cl. .................. 257/59; 257/432; 257/E31.001; 257/E31.127; 438/73

(58) Field of Classification Search ..................... 257/59, 257/432, 331.001, E31.127; 438/73
See application file for complete search history.

(56) References Cited

U.S. PATENT DOCUMENTS

| | | | |
|---|---|---|---|
| 4,673,964 A | 6/1987 | Popovic et al. | |
| 6,111,299 A | 8/2000 | Dabrowski et al. | |
| 6,701,782 B2 * | 3/2004 | Iwaki et al. | ................ 73/204.26 |
| 2001/0017371 A1 | 8/2001 | Tanaka et al. | |
| 2001/0042875 A1 * | 11/2001 | Yoshida | ........................ 257/291 |
| 2003/0124763 A1 | 7/2003 | Fan et al. | |
| 2003/0183850 A1 | 10/2003 | Pain et al. | |
| 2005/0041296 A1 | 2/2005 | Hsiao et al. | |
| 2006/0068586 A1 | 3/2006 | Pain | |
| 2006/0076590 A1 | 4/2006 | Pain et al. | |
| 2009/0065819 A1 | 3/2009 | Pain | |

OTHER PUBLICATIONS

Final Office Action from U.S. Appl. No. 11/674,608, dated Jan. 28, 2011.
Non-Final Office Action from U.S. Appl. No. 11/674,608, dated Jun. 24, 2010.
Non-Final Office Action from U.S. Appl. No. 11/674,608, dated Dec. 30, 2009.
Final Office Action from U.S. Appl. No. 11/674,608, dated Sep. 10, 2009.
Non-Final Office Action from U.S. Appl. No. 11/674,608, dated Jan. 7, 2009.
U.S. Appl. No. 60/861,688, filed Nov. 29, 2006.

* cited by examiner

*Primary Examiner* — Kimberly Nguyen
*Assistant Examiner* — Mohammad T Karimy
(74) *Attorney, Agent, or Firm* — Zilka-Kotab, PC

(57) ABSTRACT

An apparatus and associated method are provided. A first silicon layer having at least one of an associated passivation layer and barrier is included. Also included is a composite anti-reflection layer including a stack of layers each with a different thickness and refractive index. Such composite anti-reflection layer is disposed adjacent to the first silicon layer.

14 Claims, 12 Drawing Sheets

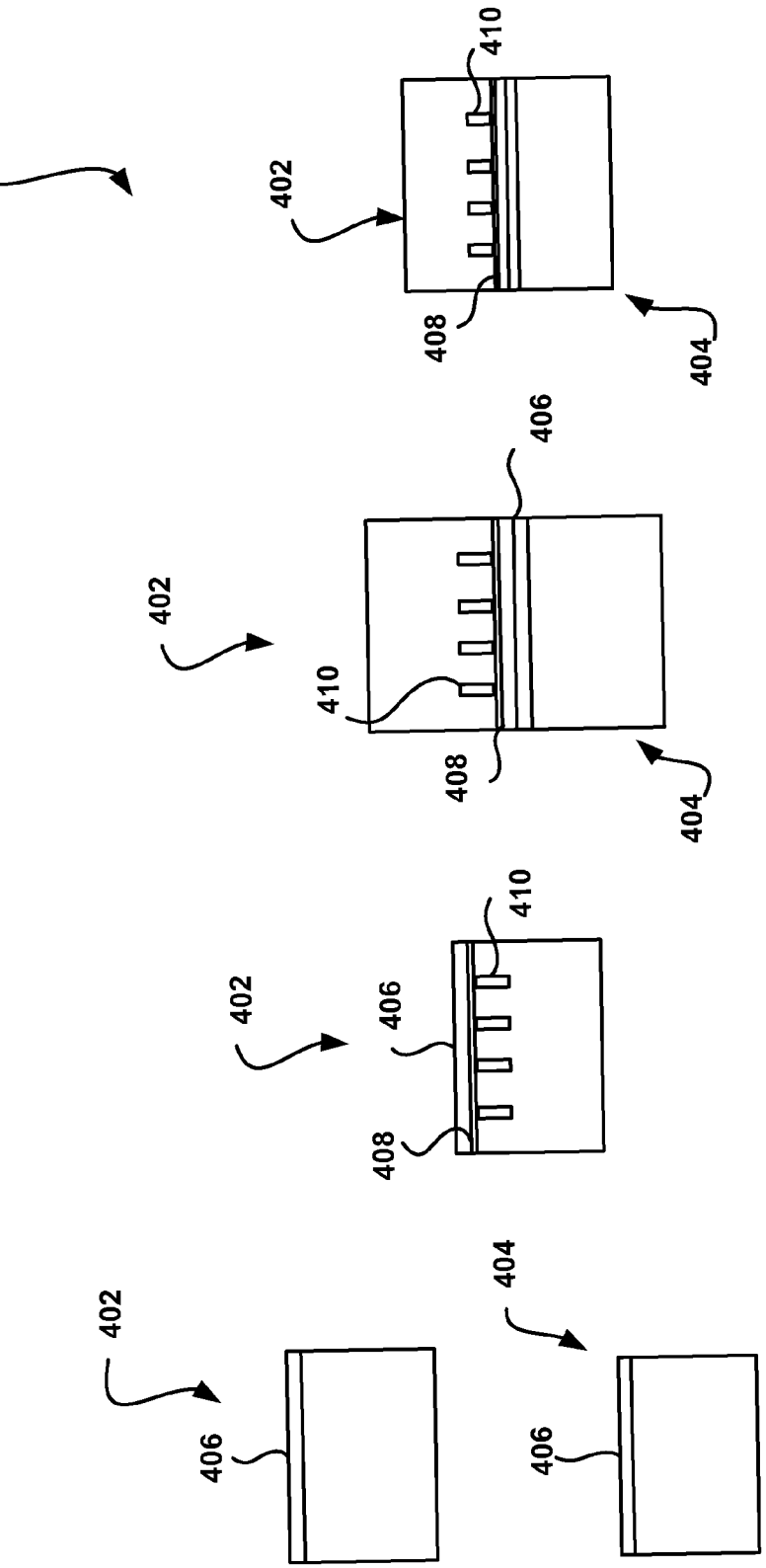

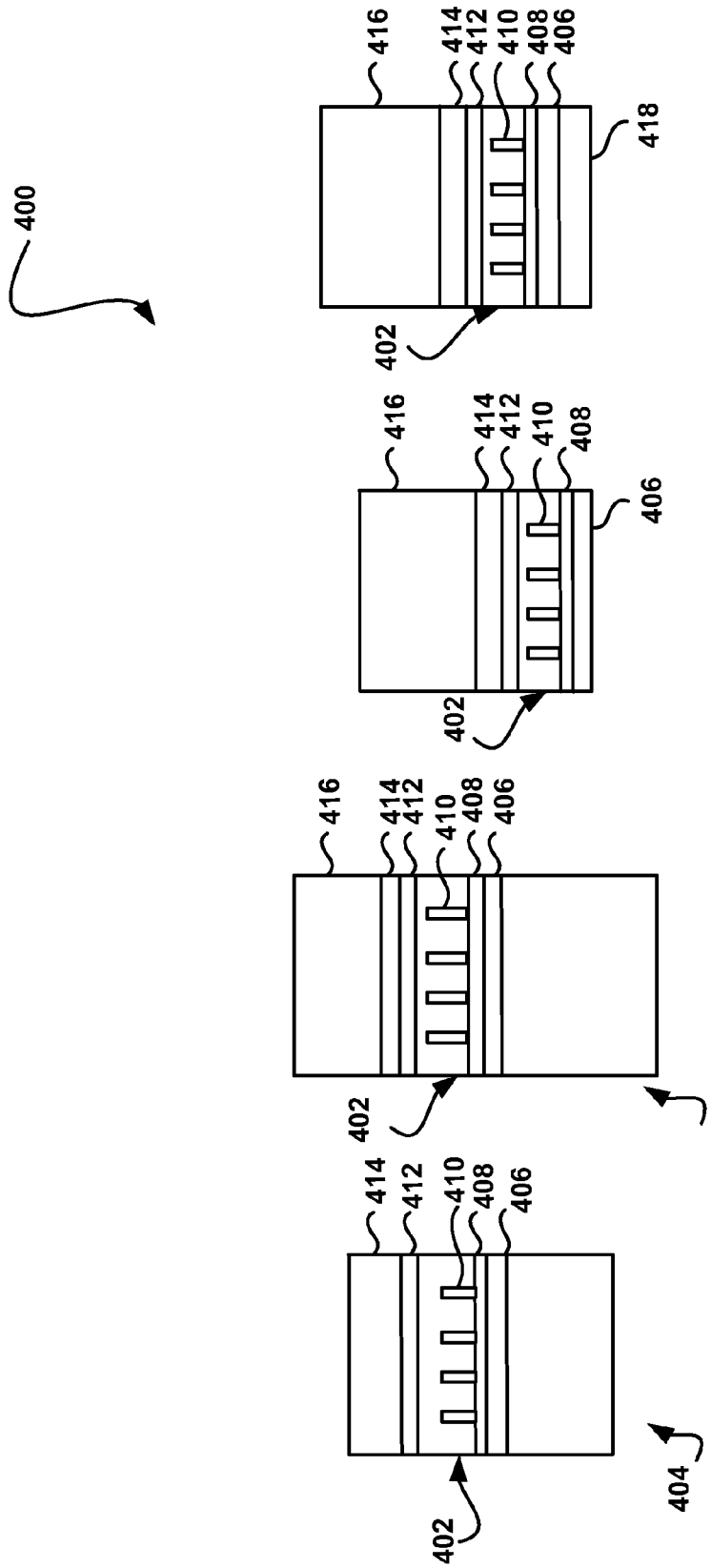

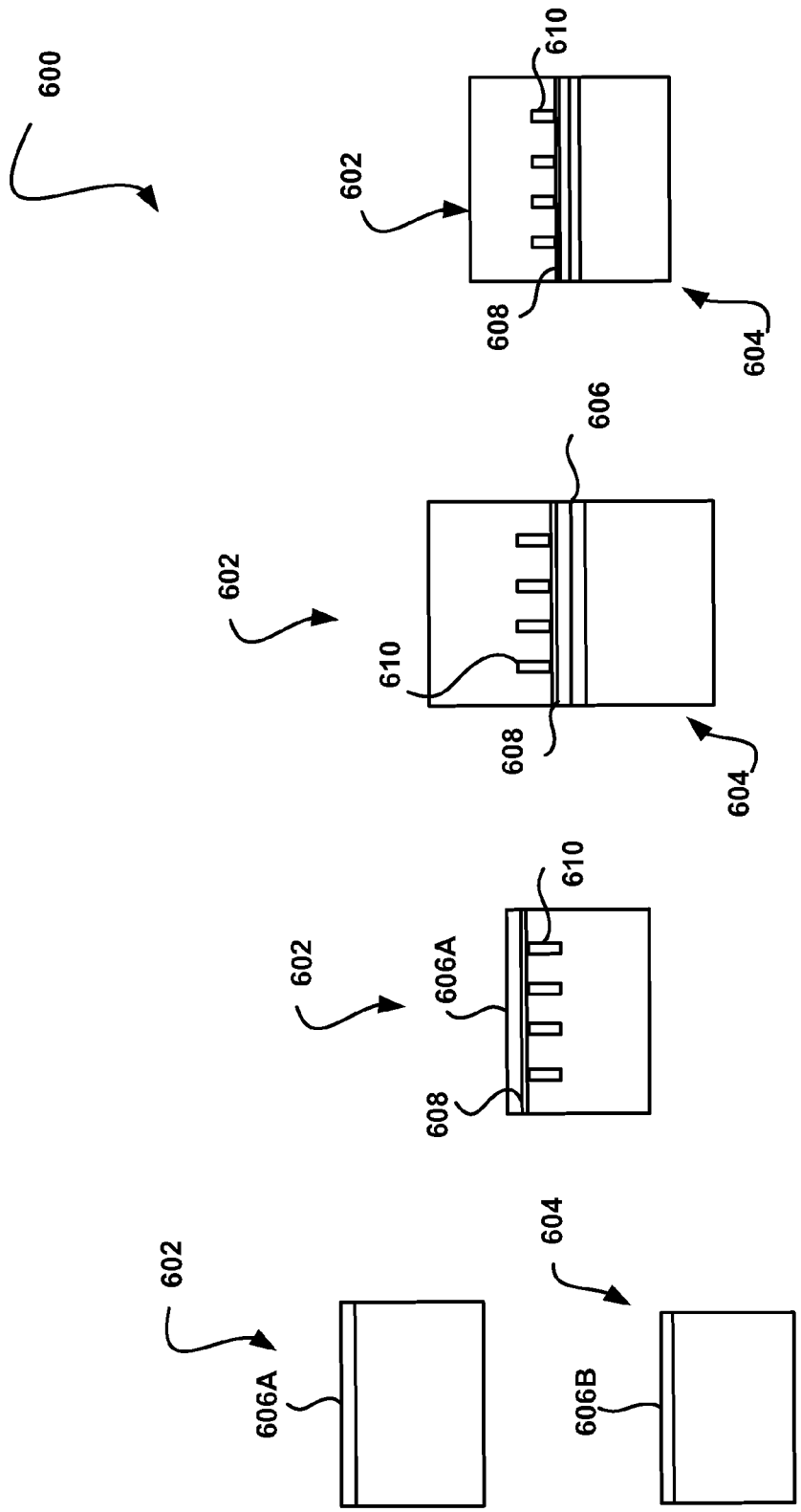

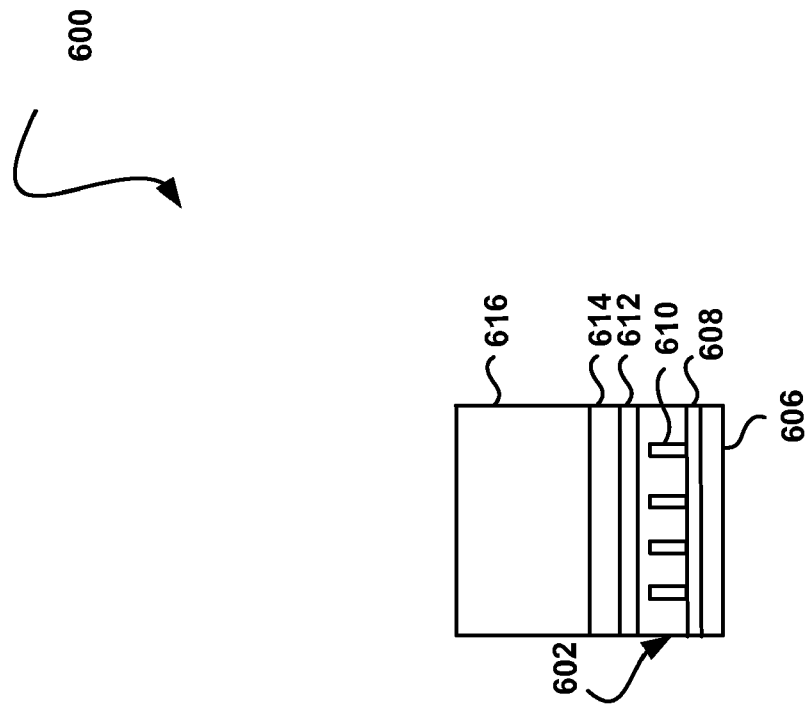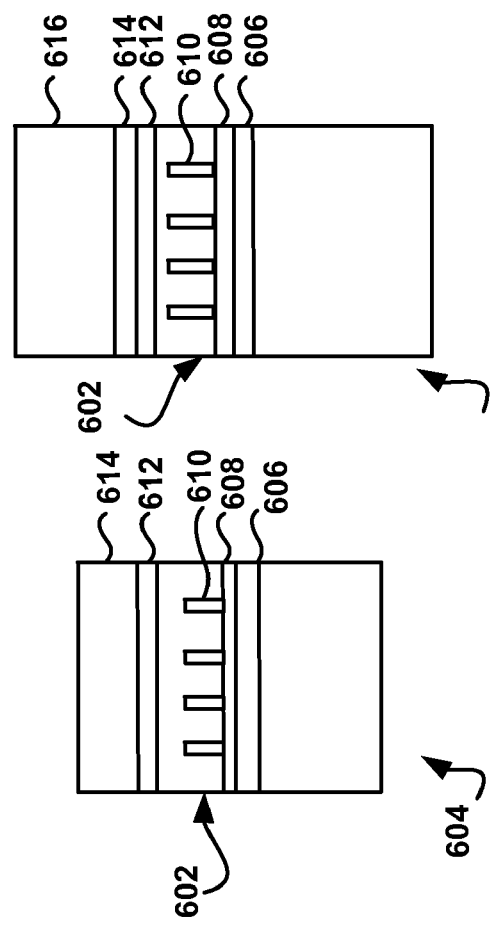

APPARATUS AND METHOD OF MANUFACTURE FOR DEPOSITING A COMPOSITE ANTI-REFLECTION LAYER ON A SILICON SURFACE

RELATED APPLICATION(S)

The present application is a continuation-in-part of U.S. application Ser. No. 11/674,608, filed Feb. 13, 2007, which claims the benefit of a provisional application filed on Feb. 16, 2006 under application Ser. No. 60/774,123, both of which are incorporated herein by reference in their entirety for all purposes.

STATEMENT REGARDING FEDERALLY SPONSORED RESEARCH OR DEVELOPMENT

The invention described herein was made in the performance of work under a NASA contract, and is subject to the provisions of Public Law 96-517 (35 USC 202) in which the Contractor has elected to retain title.

FIELD OF THE INVENTION

The present invention relates to optical sensors, and more particularly to imagers.

BACKGROUND

Cross-talk poses a significant problem for imagers (e.g. CMOS imagers, etc.). Typically, cross-talk may include the collection of photo-carriers (e.g. electrons, etc.) by imager pixels other than the one that was supposed to have collected such photo-carriers. Three types of imager cross-talk typically include spectral cross-talk, optical cross-talk, and diffusion cross-talk. Such cross-talk typically results in images with poor contrast, blurring of edges, improper color perception, non-uniform response over a field-of-view, etc.

Elimination of diffusion cross-talk, in particular, requires the collection of all photo-carriers under the influence of an electric field. A relatively high epitaxial doping that imagers typically require, coupled with continuous voltage scaling, have resulted in imager structures with depletion widths far smaller than the absorption depths of visible light. Thus, for the most part, photo-carriers in epitaxial silicon are often collected at a surface or near-surface p-n junction (or the like) through diffusion, rather than under the influence of a vertical electric field. Thus, since diffusion is an omni-directional process, lateral diffusion typically gives rise to unwanted diffusion cross-talk.

There is thus a need for addressing these and/or other issues associated with the prior art.

SUMMARY

An apparatus and associated method are provided. A first silicon layer having at least one of an associated passivation layer and barrier is included. Also included is a composite anti-reflection layer including a stack of layers each with a different thickness and refractive index. Such composite anti-reflection layer is disposed adjacent to the first silicon layer.

BRIEF DESCRIPTION OF THE DRAWINGS

FIGS. 4A-4H illustrate various stages of processing, in accordance with the method of FIG. 3.

FIGS. 6A-G illustrate one embodiment of the various stages of processing in accordance with the method of FIG. 5.

DETAILED DESCRIPTION

Figure 1:
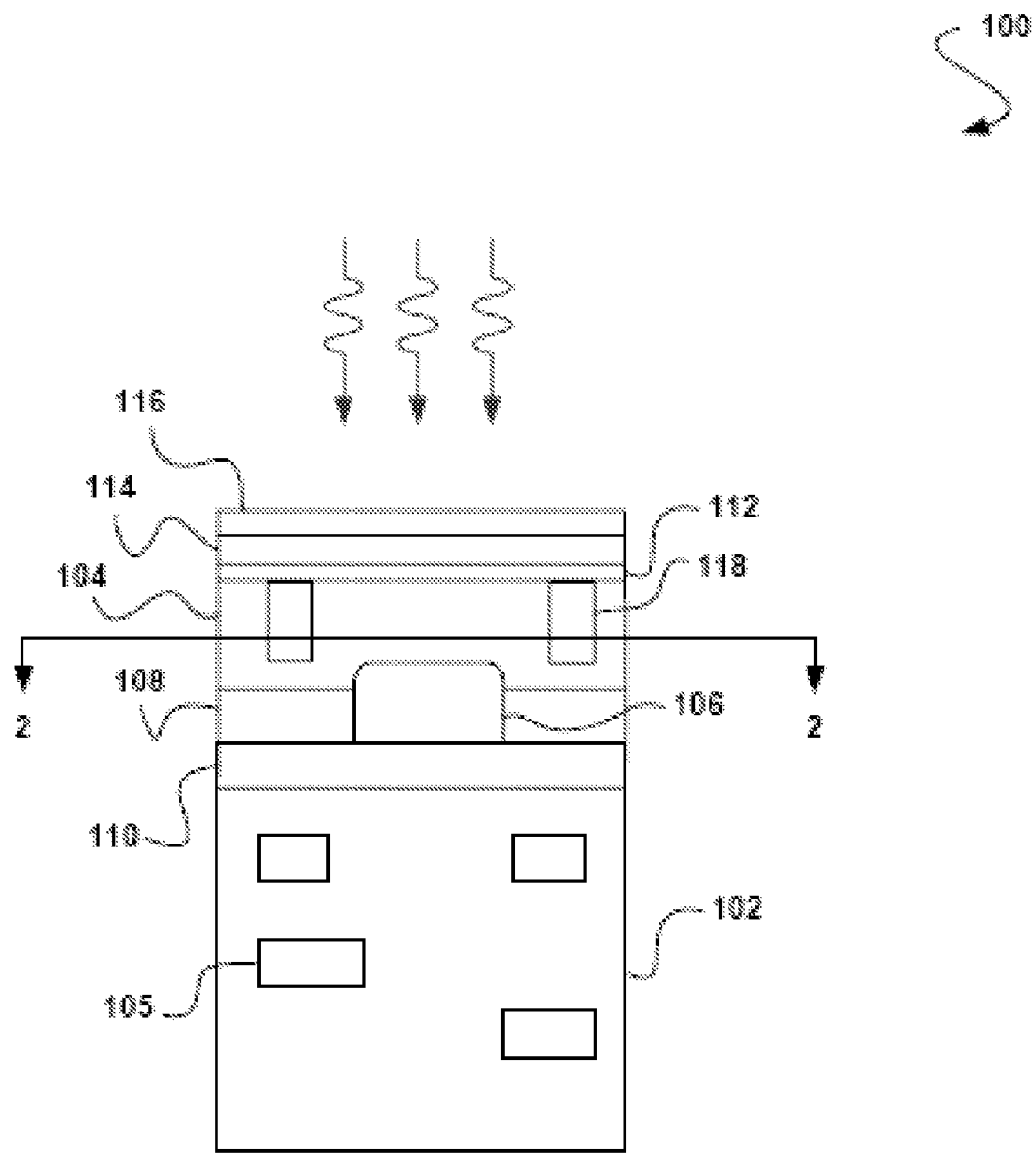
FIG. 1 illustrates a cross-section of an imager apparatus, in accordance with one embodiment.

FIG. 1 illustrates a cross-section of an imager apparatus 100, in accordance with one embodiment. In the present embodiment, the imager apparatus 100 may include a back-illuminated imager. While the imager apparatus 100 shown in FIG. 1 may represent a single imager pixel, it should be noted that an array of such pixels may be provided, in different embodiments.

Still yet, such imager apparatus 100 may be manufactured utilizing complimentary metal-oxide semiconductor (CMOS) technology. Of course, however, other types of imager apparatuses, manufacturing processes, etc. are contemplated. For example, the imager apparatus 100 may also take the form of a charge coupled device (CCD) imager.

As shown, an inter-layer dielectric (ILD) 102 is provided which is formed on the silicon wafer. Also included a silicon layer 104 of a first conductivity type acting as a junction anode. In use, such silicon layer 104 is adapted to convert light to photoelectrons. As further shown, metal layers 105 may be provided for interconnection of circuits and photo-detectors fabricated on the silicon layer (combined 104, 106, 108). Such metal layers 105 are separated and protected by the ILD 102. In one optional embodiment, the ILD 102 may extend a depth of 10 micrometers, or any other desired depth, for example.

Also included is a semiconductor well 106 of a second conductivity type formed in the silicon layer 104 for acting as a junction cathode. In one embodiment, the first conductivity type may include a p-type conductivity, and the second conductivity type may include an n-type conductivity. Of course, other embodiments are contemplated where the first conductivity type may include an n-type conductivity, and the second conductivity type may include a p-type conductivity. Still yet, in one embodiment, the semiconductor well 106 may take the form of a deep implanted n-well but, of course, may take other forms as well (such as a stacked layers of n-type and p-type implants, etc.).

Further provided is an implant region 108 of the first conductivity type disposed about the semiconductor well 106 and just above an oxide layer 110 that resides between the silicon layer 104 and the ILD 102, in the manner shown. Disposed over the silicon layer 104 is a passivation layer 112 of the first conductivity type. Such implant region 108 and the passivation layer 112 may, in one embodiment, be more heavily doped with respect to the silicon layer 104, for reasons that will soon become apparent. Further, during use, the passivation layer 112 may serve a variety of purposes, examples of which will be set forth hereinafter in the context of different embodiments.

Disposed over the passivation layer 112 is an anti-reflection layer (ARC) 114. Also, one or more color filter layers 116 may be disposed over the anti-reflection layer 114. Again, see FIG. 1.

Still yet, a barrier 118 of the first conductivity type is formed in the silicon layer 104 adjacent to the semiconductor well 106. In the context of the present description, the barrier 118 refers to a structure that is formed, disposed, etc. in any manner that serves as a barrier, at least in part. In various embodiments, for example, the barrier 118 may take the form of one or more posts or pickets, a hollow cylinder, a hollow rectangular structure, etc. surrounding the semiconductor well 106. Further, the position, size, shape, etc. of the barrier 118 may deviate from that specifically shown in FIG. 1, insofar as the aforementioned definition is met.

In FIG. 1, the barrier 118 is shown to extend from the passivation layer 112 to a point spaced from the implant region 108. Of course, during operation, an operational region associated with the barrier 118 may or may not extend completely to the implant region 108.

During operation, the barrier 118 may or may not serve to reduce cross-talk (e.g. diffusion cross-talk, etc.) at least in part, improve the funneling of the photoelectrons to the semiconductor well 106, etc. Further, the implant region 108 may optionally work in conjunction with the barrier 118 for further reducing cross-talk, directing photoelectrons, etc. Also during use, leakage (e.g. dark current, etc.) and/or blue quantum efficiency (QE) issues may or may not be addressed utilizing the passivation layer 112, in a manner that will be elaborated upon hereinafter during reference to different embodiments.

More illustrative information will now be set forth regarding various optional architectures and features of different embodiments with which the foregoing technique may or may not be implemented, per the desires of the user. It should be strongly noted that the following information is set forth for illustrative purposes and should not be construed as limiting in any manner. Any of the following features may be optionally incorporated with or without the other features described.

In one example of use, incident light may pass through the color filter layers 116, ARC layer 114, and passivation layer 112 before being absorbed in the underlying silicon layer 104. As mentioned earlier, the silicon layer 104 may include a low-doped silicon, with a heavily-doped surface (see passivation layer 112) and a heavily-doped deeper silicon barrier 118 that penetrates the silicon layer 104. The photoelectrons generated in the silicon layer 104 are collected in the reverse-biased junction (e.g. p-n junction, etc.) formed between the semiconductor well 106 and the silicon layer 104.

During use, the passivation layer 112 may serve a variety of purposes. For example, the passivation layer 112 may serve to hold the adjacent surface of the silicon layer 104 in accumulation (i.e. at one potential, etc.), thus preventing interface traps from being electrically active, for passivating them. Being electrically inactive, the traps are incapable of fully participating in the thermal dark current generation process, nor do they fully trap photoelectrons generated near the surface of the silicon layer 104.

As a corollary to the above feature, blue light may be absorbed close to the surface of the silicon layer 104, as a result of the passivation layer 112. To this end, blue QE is preserved.

Still yet, in various embodiments, the passivation layer 112 may serve to drive photo-carriers into the silicon layer 104 and towards the semiconductor well 106. This may result from the fact that the passivation layer 112 is "smeared" during associated thermal processing (which will be described later in greater detail) such that the doping is of a higher concentration at an upper surface and dissipates thereneath. Such doping gradient, in turn, creates a vertical field that drives the photo-carriers in the abovementioned manner.

In the embodiment shown in FIG. 1, the barrier 118 surrounds the semiconductor well 106. By this structure, the barrier 118 provides potential barriers to lateral electron flow, preventing lateral diffusion and therefore suppressing diffusion cross-talk, at least in part. In various different embodiments, the implant energy and dose of the implant region 108 and barrier 118 may be chosen such that their respective regions touch each other vertically, providing an enhanced potential barrier to lateral electron flow. Through the use of the lower-doped silicon layer 104, semiconductor well 106, barrier 118, and implant region 108; each pixel may be optically and/or electrically isolated from each other. In addition to the foregoing features, the barrier 118 may also work in conjunction with the passivation layer 112 and implant region 108 for further funneling any photo-carriers into the silicon layer 104 and towards the semiconductor well 106.

Thus, any carriers generated in the semiconductor well 106 may, in some embodiments, be collected with 100% (or near 100%) collection efficiency, since the semiconductor well 106 is bounded by the implant region 108, the barrier 118, passivation layer 112, providing a potential barrier to electron back-flow out of the semiconductor well 106, etc. To this end, each pixel may provide 100% (or near 100%) quantum yield over a wavelength of response, while the top ARC 112 minimizes reflection loss. Together, such features may provide high QE and low pixel-to-pixel cross-talk.

In one possible embodiment, the apparatus 100 may represent one of a multiplicity of devices that are configured in a system array. An illustrative example of such system array may be found with reference to U.S. Patent Application Publication No.: 2006/0076590A1 filed Sep. 13, 2005, which is incorporated herein by reference in its entirety for all purposes. Of course, such exemplary system array is set forth for illustrative purposes only and should not be construed as limiting in any manner whatsoever.

Figure 2A:
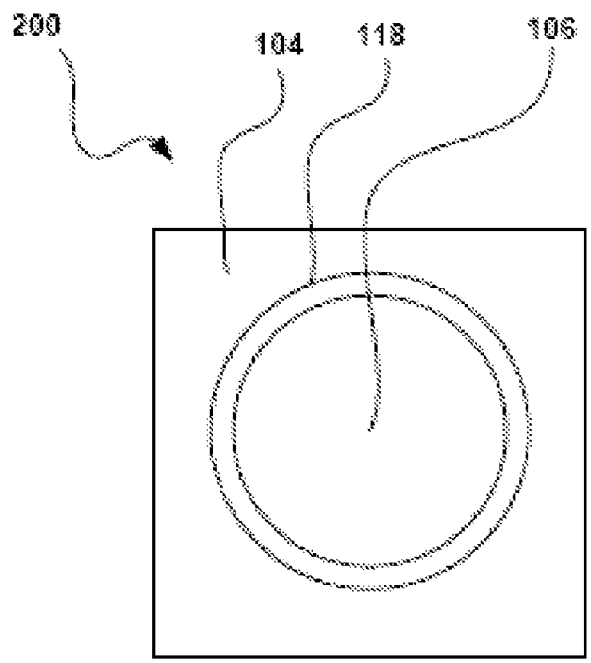
FIG. 2A shows an exemplary cross-section of the barrier of FIG. 1 that is taken along line 2-2 of FIG. 1, in accordance with another embodiment.

FIG. 2A shows an exemplary cross-section 200 of the barrier 118 of FIG. 1 that is taken along line 2-2 of FIG. 1, in accordance with another embodiment. As shown, the barrier 118 is formed in the silicon layer 104 and circumnavigates the semiconductor well 106. While the barrier 118 of FIG. 2A is shown to be continuous in form and to surround the semiconductor well 106, it should be noted that the periphery of the barrier 118 may be discontinuous, vary in shape, size, etc. Further, while a circular shape is illustrated, such shape may deviate as well. See FIG. 2B, for example.

Figure 2B:
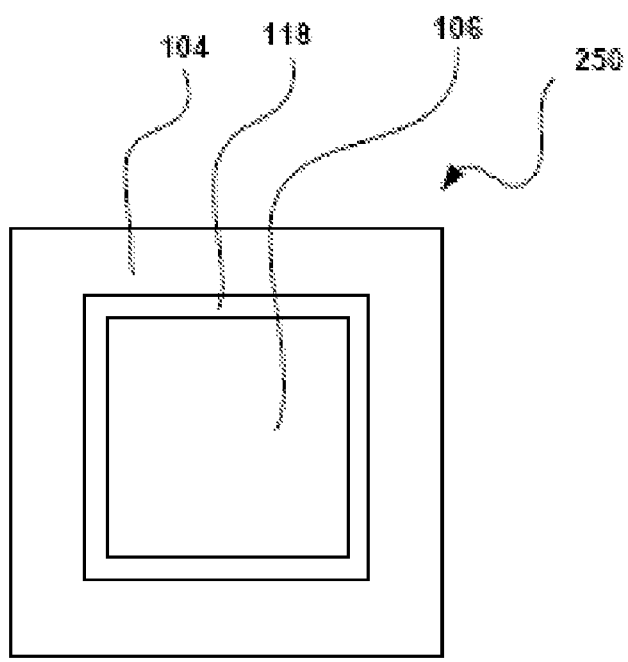
FIG. 2B shows another exemplary cross-section of the barrier of FIG. 1 that is taken along line 2-2 of FIG. 1, in accordance with yet another embodiment.

FIG. 2B shows another exemplary cross-section 250 of the barrier 118 of FIG. 1 that is taken along line 2-2 of FIG. 1, in accordance with yet another embodiment. As shown, the barrier 118 is formed in the silicon layer 104 and circumnavigates the semiconductor well 106. Further, the present barrier 118 is shown to be rectangular in shape. Similar to the embodiment of FIG. 2A, a periphery of the barrier 118 may be discontinuous, vary in shape, size, etc.

Figure 3:
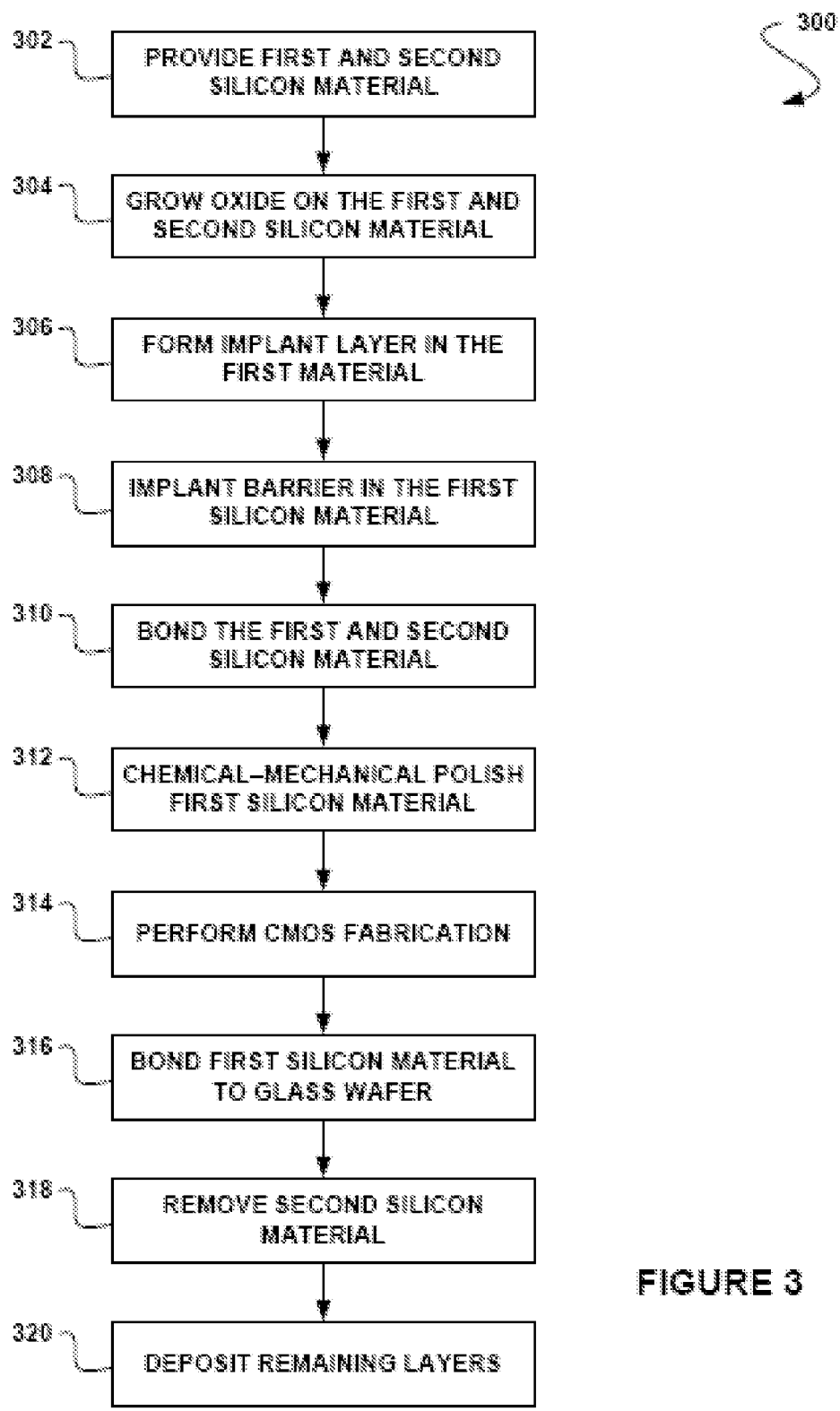
FIG. 3 illustrates a method for manufacturing a starter material and a resultant imager, in accordance with another embodiment.

FIG. 3 illustrates a method 300 for manufacturing a starter material and a resultant imager, in accordance with another embodiment. As an option, the method 300 may be used to manufacture the imager apparatus 100 of FIG. 1. Further, the definitions provided above may equally apply to the present description.

As shown, a first silicon material (e.g. device silicon wafer, etc.) and a second silicon material (e.g. support/handle silicon wafer, etc.) are provided. See operation 302. Thereafter, an oxide is grown on the first and second silicon material, as shown in operation 304. In one embodiment, such oxide may exhibit enhanced purity. FIG. 4A illustrates a first silicon material 402 and a second silicon material 404 each with an oxide 406 formed thereon. While the oxide 406 is shown to be grown on the second silicon material 404, it should be noted that such oxide 406 may be omitted in other embodiments. As an option, oxide may be grown only on the first silicon material 402, only on the second silicon material 404, etc., and such silicon 402, 404 may bond to the oxide (e.g. as in operation 310).

Next, in operation 306, an implantation layer is formed in the first silicon material. In one embodiment, a blanket of Boron may be implanted. Of course, other elements may be used in other embodiments. In use, such implanted ions are adapted to penetrate the oxide grown in operation 304.

Still yet, in operation 308, a barrier is implanted in the first silicon material. Such barrier may take on any form set forth hereinabove. To accomplish this, in accordance with one embodiment, a wafer may be patterned with photoresist, so that Boron (or any other element, etc.) may be implanted at the appropriate places, in order to create the barrier structure. As an option, the blanket implantation may be utilized without necessarily utilizing the barrier.

FIG. 4B illustrates the first silicon material 402 with both the implantation layer 408 and barriers 410 formed therein. In one embodiment, the barriers 410 may be implanted to penetrate 2 micrometers into the first silicon material 402. It should be noted that multiple barriers 410 are shown in FIG. 4B, since multiple devices are to be formed therein, as well will soon be set forth.

Turning now to operation 310, the oxides of the first and second silicon material are bonded. In various embodiments, this may be accomplished utilizing a low heat bonding process, or any other desired process, for that matter. Specifically, in one embodiment, the first and second silicon materials may undergo low temperature oxide-to-oxide or oxide-to-silicon bonding, thereby forming a buried oxide structure with a top layer consisting of the device silicon and the barrier structure. As an option, such low temperature bonding may be followed by a higher temperature annealing process.

Next, a CMP, or a lapping and polishing, process is employed to reduce a depth of the first silicon material. See operation 312. Such CMP/lapping process may be followed by a wet-etch and polish process to generate a silicon layer of appropriate thickness. FIG. 4C illustrates the first and second silicon material 402, 404 bonded to each other, while FIG. 4D shows the first silicon material 402 after the aforementioned CMP.

It should be noted that the structure of FIG. 4D may be achieved in any desired manner. For example, a silicon material may be provided with a pure oxide disposed thereon. Next, the barrier and/or implantation layer may be deposited, after which additional silicon material may be grown over the barrier and/or implantation layer. To this end, the structure in FIG. 4C may not necessarily be formed with the barrier 410 and/or implantation layer 408 built-in. In one embodiment, if the implantation layer 408 is missing, it may be added utilizing implantation. In another optional embodiment, if barrier 410 is missing, it may be added via masking and selective implantation, thus resulting in the structure of FIG. 4D.

With continuing reference to FIG. 3, a CMOS fabrication process is then carried out, per operation 314. In one possible embodiment, a bulk CMOS process flow may be used to generate a plurality of CMOS imagers through implantation, oxidation, ILD, metal deposition, and/or patterning at the wafer level. It should be noted that any bulk CMOS process may be used. For example, a bulk CMOS process may be optimized for imaging. By this process, various structures may be formed including, but not limited to a deep semiconductor well, MOSFETs, capacitors, and/or other devices. FIG. 4E shows the first silicon material 402 after the aforementioned CMOS, where the resultant structure includes a device layer 412 and ILD 414 as shown.

In operation 316, the first silicon material is bonded to a glass wafer for mechanical support. Further, in operation 318, the second silicon material is removed, through mechanical grinding, wet etching, and/or reactive ion etching (RIE), for example. FIG. 4F illustrates the first silicon material 402 being bonded to a glass or silicon wafer or other substrate 416, and FIG. 4G illustrates the second silicon material 404 being removed, at least in part.

Thereafter, an ARC layer is deposited. See operation 320 and item 418 in FIG. 4H. Such ARC layer is capable of providing improved optical coupling through a suppression of reflection at the silicon material/oxide (e.g. Si—SiO$_2$, etc.) interface.

In various embodiments, the quality of the Si—SiO2 interface at the exposed back silicon surface may play a role in short wavelength QE and dark current. An increased number of interface traps that is associated with surface damage and dangling bonds may cause unwanted potential build up at the back-surface that may prevent the photoelectrons generated by blue light close to the surface from being collected, while the density of interface traps may increase the dark current. Both of these effects may be eliminated by keeping the back Si—SiO2 interface in thermal equilibrium.

Figure 5:
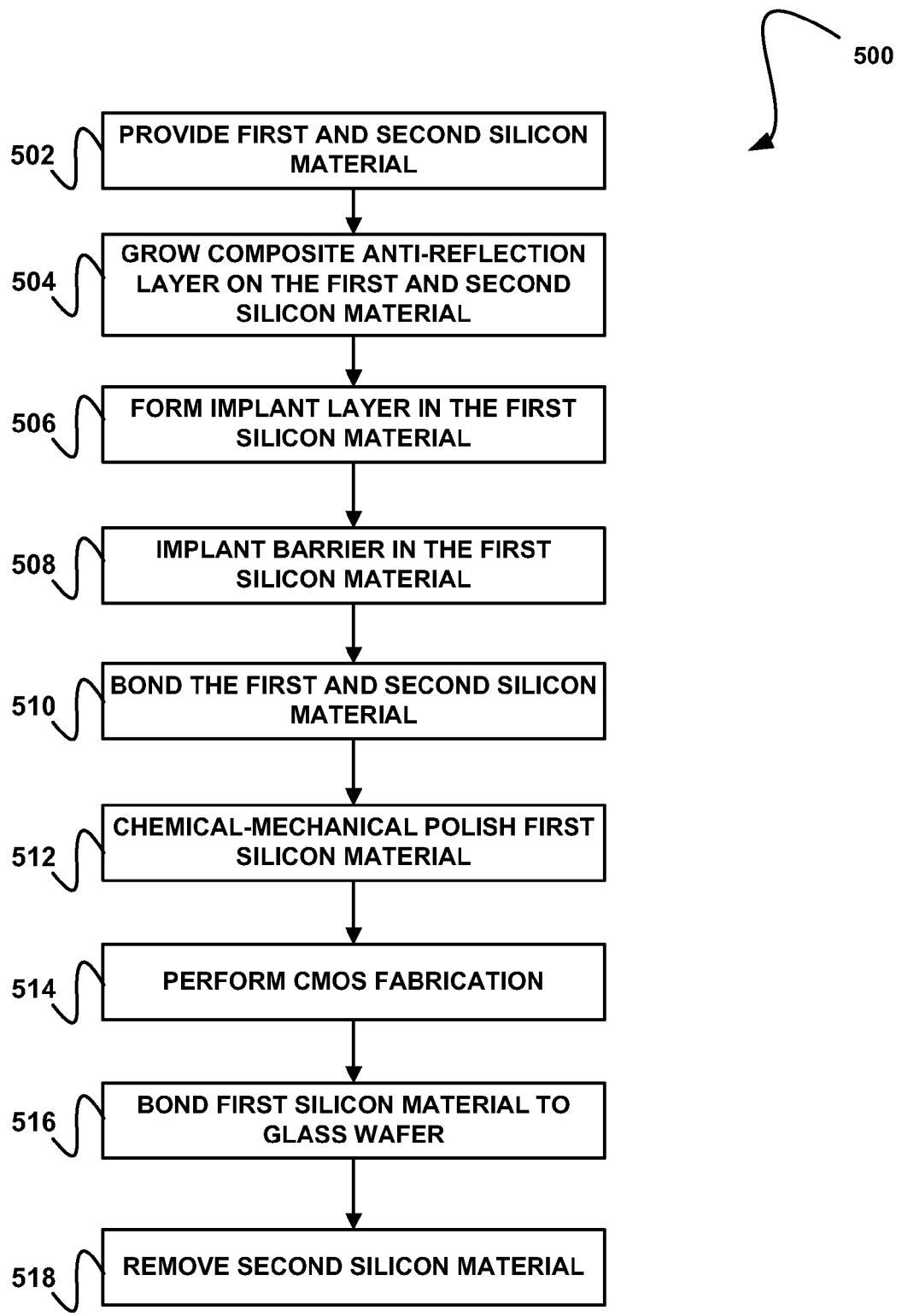
FIG. 5 illustrates a method for manufacturing a starting material, the starting material including a composite anti-reflection layer, and a resultant imager, in accordance with another embodiment.

FIG. 5 illustrates a method 500 for manufacturing a starting material, the starting material including a composite anti-reflection layer, and a resultant imager, in accordance with another embodiment. As an option, the method 500 may be used to manufacture the imager apparatus 500 of FIG. 1. Further, the definitions provided above may equally apply to the present description.

As shown, a first silicon material (e.g. device silicon wafer, etc.) and a second silicon material (e.g. support/handle silicon wafer, etc.) are provided. See operation 502. Thereafter, a composite anti-reflection layer is grown on the first and second silicon material, as shown in operation 504. In one embodiment, such composite anti-reflection layer may exhibit enhanced purity.

FIG. 6A illustrates a first silicon material 602 and a second silicon material 604 each with a composite anti-reflection layer 606 formed thereon. With respect to the present description, the composite anti-reflection layer 606 may include any layer having a stack of layers each with a different thickness and refractive index. For example, the composite anti-reflection layer 606 may include a combination of oxide and an ARC, such as the oxide 406 and the ARC 418 in FIGS. 4A-H. One example of such a composite anti-reflection layer 606 will be described below with respect to FIG. 7.

Such ARC may be capable of providing improved optical coupling through a suppression of reflection at the interface with the silicon material. For example, the ARC may minimize reflection losses (e.g. where a certain portion of the incident light is reflected back resulting in a reduction in net quantum efficiency) whenever light enters one material to another with different refractive indices.

While the composite anti-reflection layer 606 is shown to be grown on the second silicon material 604, it should be noted that such composite anti-reflection layer 606 may be omitted in other embodiments. As an option, composite anti-reflection layer 606 may be grown only on the first silicon material 602, only on the second silicon material 604, etc., and such silicon 602, 604 may bond to the composite anti-reflection layer 606 (e.g. as in operation 510). Thus, for example, a first portion of the composite anti-reflection layer 606A may be deposited on the first silicon material 602 and a second portion of the composite anti-reflection layer 606B may be deposited on the second silicon material 604, such that the composite anti-reflection layer 606 is formed when the first portion of the composite anti-reflection layer 606A is bonded to the second portion of the composite anti-reflection layer 606B (as described below with respect to operation 510). In one embodiment, the composite anti-reflection layer 606 may be formed on the first silicon material 602 and/or second silicon material 604 by depositing each layer of the composite anti-reflection layer 606 on such first silicon material 602 and/or second silicon material 604 layer-by-layer.

Next, in operation 506, an implantation layer is formed in the first silicon material. In one embodiment, a blanket of Boron may be implanted. Of course, other elements may be used in other embodiments. In use, such implanted ions are adapted to penetrate the composite anti-reflection layer grown in operation 504.

Still yet, in operation 508, a barrier is implanted in the first silicon material. Such barrier may take on any form set forth hereinabove. To accomplish this, in accordance with one embodiment, a wafer may be patterned with photoresist, so that Boron (or any other element, etc.) may be implanted at the appropriate places, in order to create the barrier structure. As an option, the blanket implantation may be utilized without necessarily utilizing the barrier.

FIG. 6B illustrates the first silicon material 602 with both the implantation layer 608 and barriers 610 formed therein. In one embodiment, the barriers 610 may be implanted to penetrate 2 micrometers into the first silicon material 602. It should be noted that multiple barriers 610 are shown in FIG. 6B, since multiple devices are to be formed therein, as well will soon be set forth.

Turning now to operation 510, the composite anti-reflection layers 606A, 606B of the first and second silicon material are bonded to form a single composite anti-reflection layer 606. In various embodiments, this may be accomplished utilizing a low heat bonding process, or any other desired process, for that matter. Specifically, in one embodiment, the first and second silicon materials may undergo low temperature composite anti-reflection layer-to-composite anti-reflection layer or composite anti-reflection layer-to-silicon bonding, thereby forming a buried composite anti-reflection layer structure with a top layer consisting of the device silicon and the barrier structure. As an option, such low temperature bonding may be followed by a higher temperature annealing process.

Figure 8:
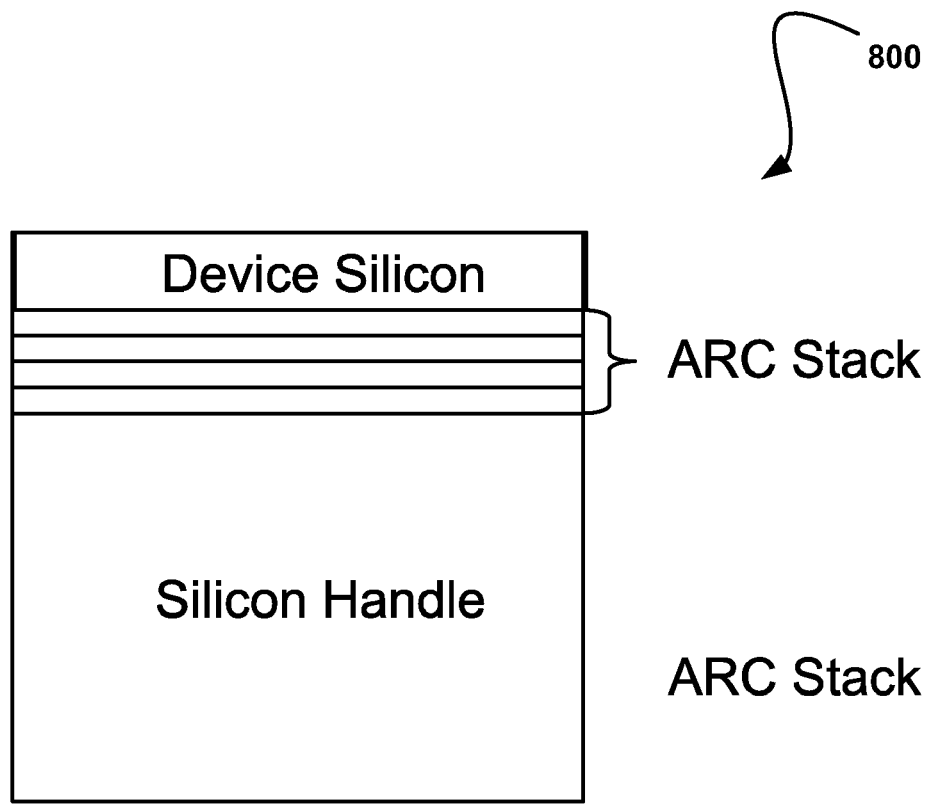
FIG. 8 illustrates one example of the starting material manufactured in accordance with the method of FIG. 5.

In this way, a starting material may be provided which includes the first silicon material 602, the composite anti-reflection layer 606 disposed adjacent to the first silicon material 602, and the second silicon material 604 disposed adjacent to the composite anti-reflection layer 606 opposite the first silicon material 602. FIG. 8 illustrates one example of the aforementioned starting material, in which the first silicon material 602 (device silicon as shown, which is the device silicon wafer) is bonded to the second silicon material 604 (silicon handle as shown, which is the silicon handle wafer) via the composite anti-reflection layer 606 (ARC stack as shown). By combining the ARC and the oxide in the composite anti-reflection layer 606 of the starting material, a presence of a thick oxide layer in immediate vicinity of the first silicon layer (e.g. whereby no other materials deposited on top of a starting material can minimize reflection losses) may be avoided.

Next, a CMP, or a lapping and polishing, process is employed to reduce a depth of the first silicon material. See operation 512. Such CMP/lapping process may be followed by a wet-etch and polish process to generate a silicon layer of appropriate thickness. FIG. 6C illustrates the first and second silicon material 602, 604 bonded to each other, while FIG. 6D shows the first silicon material 602 after the aforementioned CMP.

It should be noted that the structure of FIG. 6D may be achieved in any desired manner. For example, a silicon material may be provided with the composite anti-reflection layer disposed thereon. Next, the barrier and/or implantation layer may be deposited, after which additional silicon material may be grown over the barrier and/or implantation layer. To this end, the structure in FIG. 6C may not necessarily be formed with the barrier 610 and/or implantation layer 608 built-in. In one embodiment, if the implantation layer 608 is missing, it may be added utilizing implantation. In another optional embodiment, if barrier 610 is missing, it may be added via masking and selective implantation, thus resulting in the structure of FIG. 6D.

With continuing reference to FIG. 5, a CMOS fabrication process is then carried out, per operation 514. In one possible embodiment, a bulk CMOS process flow may be used to generate a plurality of CMOS imagers through implantation, oxidation, ILD, metal deposition, and/or patterning at the wafer level. It should be noted that any bulk CMOS process may be used. For example, a bulk CMOS process may be optimized for imaging. By this process, various structures may be formed including, but not limited to a deep semiconductor well, MOSFETs, capacitors, and/or other devices. FIG. 6E shows the first silicon material 602 after the aforementioned CMOS, where the resultant structure includes a device layer 612 and ILD 614 as shown.

In operation 516, the first silicon material is bonded to a glass or a silicon wafer for mechanical support. Further, in operation 518, the second silicon material is removed, through mechanical grinding, wet etching, and/or reactive ion etching (RIE), for example. FIG. 6F illustrates the first silicon material 602 being bonded to a glass or silicon wafer or other substrate 616, and FIG. 6G illustrates the second silicon material 404 being removed, at least in part.

Figure 7:
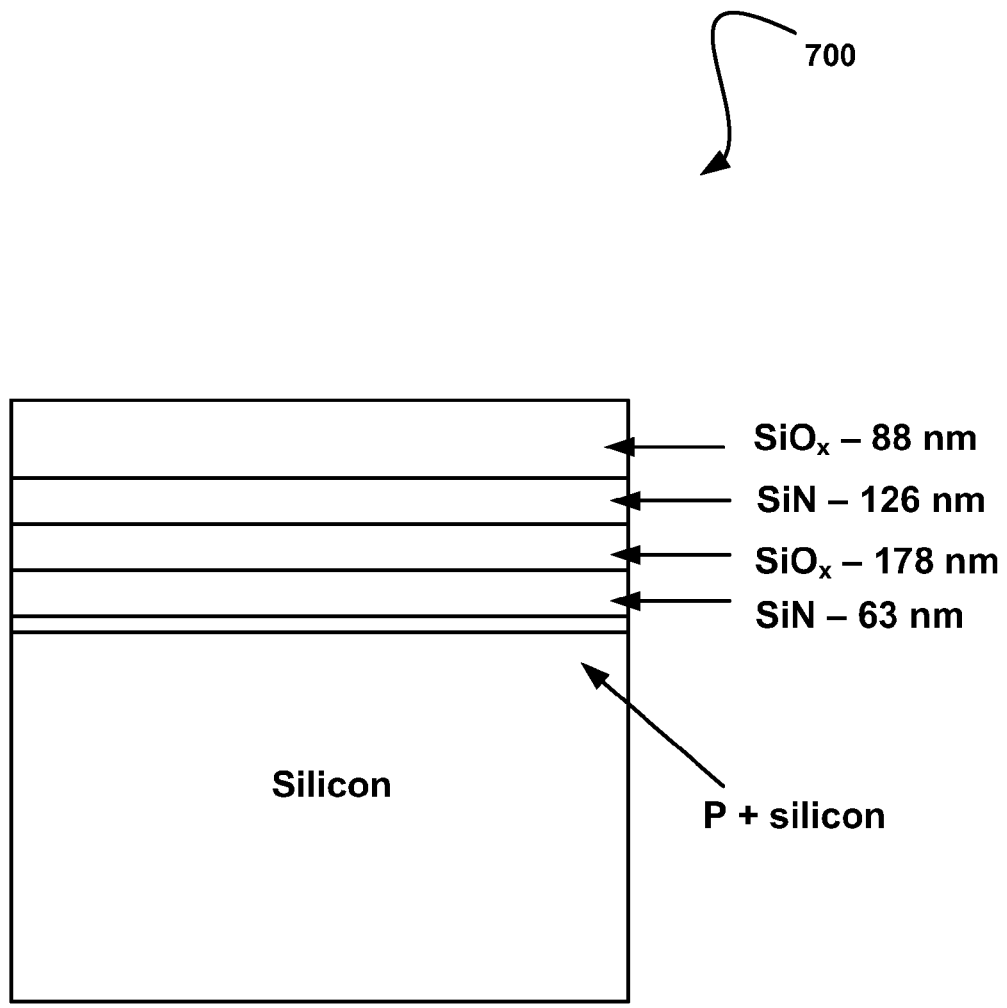
FIG. 7 illustrates a composite anti-reflection layer, in accordance with yet another embodiment.

FIG. 7 illustrates a composite anti-reflection layer 700, in accordance with yet another embodiment. As an option, the composite anti-reflection layer 700 may be implemented in the context of the architecture and environment of FIGS. 1-6. Of course, however, the composite anti-reflection layer 700 may be implemented in any desired environment. It should also be noted that the aforementioned definitions may apply during the present description.

As shown, the composite anti-reflection layer 700 includes a multiple-layer stack of thin films of different refractive indices. The different refractive indices may allow the composite anti-reflection layer 700 to be utilized for minimizing reflection for incident light at different angles and different wavelengths. Since the photo-collecting material is silicon (e.g. the first silicon layer 602 of FIG. 6A), the thin films may be of alternating high and low refractive indices.

The stack of thin films may optionally include alternating layers of at least SiN and $SiO_x$. As another option, other materials, such as MgF and $HfO_2$ may also be used. Just by way of example, the composite anti-reflection layer 700 shown may achieve reflection losses below 7% in the visible band (400-750 nm). Further, the thin films included in the multiple-layer stack of the composite anti-reflection layer 700 are also of different thicknesses.

Figures 9A, 9B, 9C:
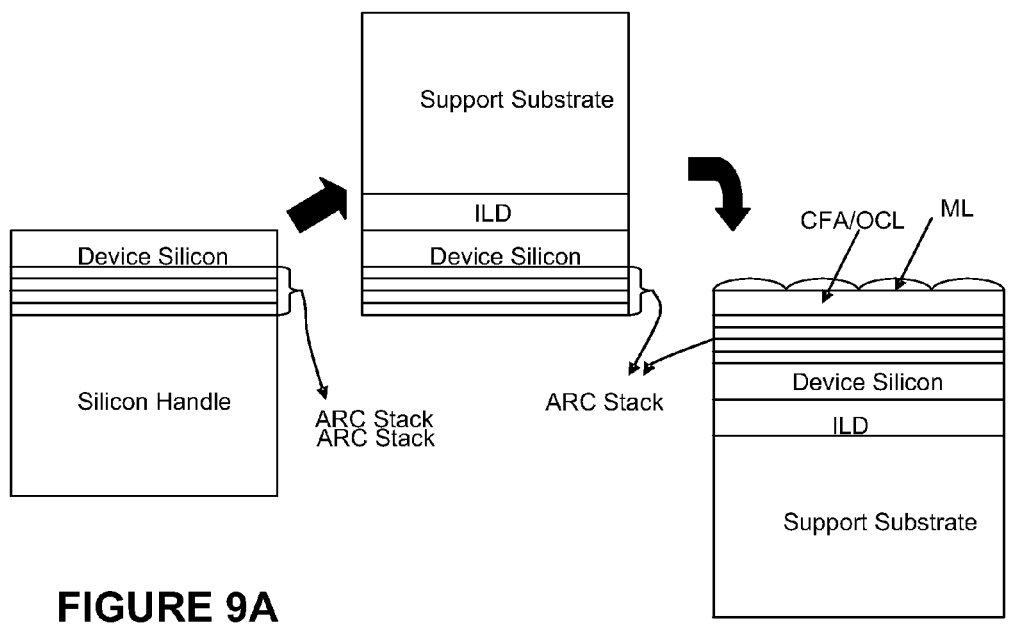
FIG. 9A-C illustrate another embodiment of the various stages of processing in accordance with the method of FIG. 5.

FIGS. 9A-C illustrates another embodiment of the various stages of processing in accordance with the method of FIG. 5. Using the starting material (e.g. starting wafer) shown in FIG. 9A, imager pixels and circuits may be deposited on the device silicon, followed by inter-layer dielectrics (ILD) and metals, as further shown in FIG. 9B. The entire structure (including the device silicon, starting material, imager pixels and circuits, and ILD and metals) may then be mounted on a support substrate, and the handle wafer may be etched off, stopping on the ARC, as shown in FIG. 9C. Color filter and microlens may then be applied on top of the ARC, as also shown in FIG. 9C. In this way, a CMOS imager with an efficient ARC may be provided.

The foregoing description has set forth only a few of the many possible implementations. For this reason, this detailed description is intended by way of illustration, and not by way of limitations. Variations and modifications of the embodiments disclosed herein may be made based on the description set forth herein, without departing from the scope and spirit of the present application.

Figure 10:
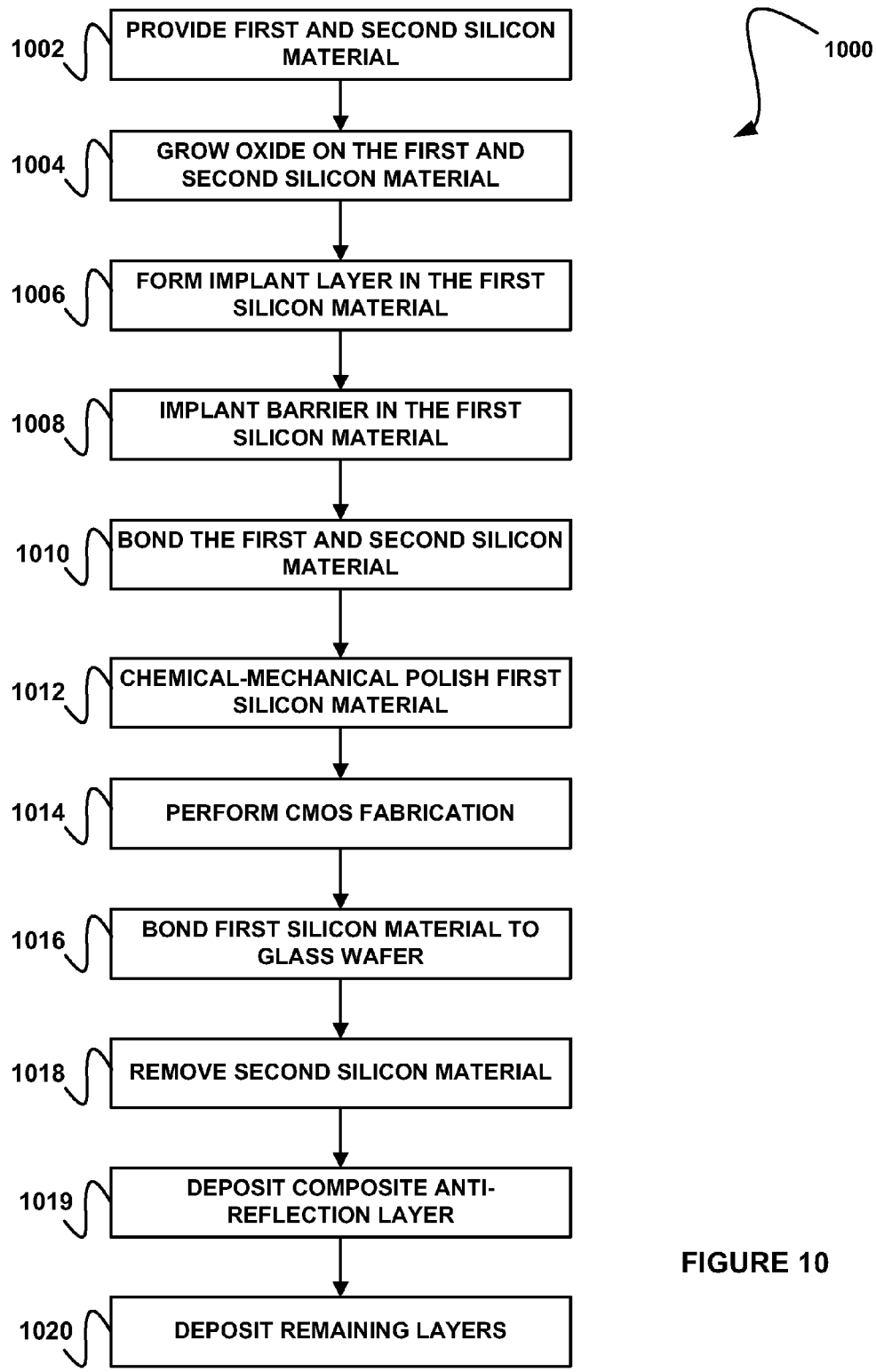
FIG. 10 illustrates a method for manufacturing an imager using a composite anti-reflection layer, in accordance with another embodiment.

FIG. 10 illustrates a method 1000 for manufacturing an imager using a composite anti-reflection layer, in accordance with another embodiment. As an option, the method 1000 may be used to manufacture the imager apparatus 100 of FIG. 1. Further, the definitions provided above may equally apply to the present description.

As shown, a first silicon material (e.g. device silicon wafer, etc.) and a second silicon material (e.g. support/handle silicon wafer, etc.) are provided. See operation 1002. Thereafter, an oxide is grown on the first and second silicon material, as shown in operation 1004. In one embodiment, such oxide may exhibit enhanced purity. Of course, it should be noted that the oxide may be grown only on the first silicon material, only on the second silicon material, etc., and such silicon may bond to the oxide (e.g. as in operation 1010).

Next, in operation 1006, an implantation layer is formed in the first silicon material. In one embodiment, a blanket of Boron may be implanted. Of course, other elements may be used in other embodiments. In use, such implanted ions are adapted to penetrate the oxide grown in operation 1004.

Still yet, in operation 1008, a barrier is implanted in the first silicon material. Such barrier may take on any form set forth hereinabove. To accomplish this, in accordance with one embodiment, a wafer may be patterned with photoresist, so that Boron (or any other element, etc.) may be implanted at the appropriate places, in order to create the barrier structure. As an option, the blanket implantation may be utilized without necessarily utilizing the barrier.

Turning now to operation 1010, the oxides of the first and second silicon material are bonded. In various embodiments, this may be accomplished utilizing a low heat bonding process, or any other desired process, for that matter. Specifically, in one embodiment, the first and second silicon materials may undergo low temperature oxide-to-oxide or oxide-to-silicon bonding, thereby forming a buried oxide structure with a top layer consisting of the device silicon and the barrier structure. As an option, such low temperature bonding may be followed by a higher temperature annealing process.

Next, a CMP, or a lapping and polishing, process is employed to reduce a depth of the first silicon material. See operation 1012. Such CMP/lapping process may be followed by a wet-etch and polish process to generate a silicon layer of appropriate thickness.

With continuing reference to FIG. 10, a CMOS fabrication process is then carried out, per operation 1014. In one possible embodiment, a bulk CMOS process flow may be used to generate a plurality of CMOS imagers through implantation, oxidation, ILD, metal deposition, and/or patterning at the wafer level. It should be noted that any bulk CMOS process may be used. For example, a bulk CMOS process may be optimized for imaging. By this process, various structures may be formed including, but not limited to a deep semiconductor well, MOSFETs, capacitors, and/or other devices.

In operation 1016, the first silicon material is bonded to a glass wafer for mechanical support. Further, in operation 1018, the second silicon material is removed, through mechanical grinding, wet etching, and/or reactive ion etching (RIE), for example.

Moreover, in operation 1019, a composite anti-reflection layer (such as that described above with respect to FIG. 7) is deposited. For example, using the device silicon as an etch-stop layer, the buried oxide may be etched off using a wet chemical etch [e.g. buffered oxide etch (HF)]. Following the etching, alternating layers of thin films are deposited using materials that that may be used in very-large-scale-integration (VLSI) processing, such as SiN and SiOx, such that the composite anti-reflection layer is deposited on the first silicon layer. As an option, other materials such as MgF and HfO2 may also be used as layers of the composite anti-reflection layer.

In this way, an optimized composite anti-reflection layer can be designed for the increased optical performance (i.e. minimized reflection and absorption), and deposited on the first silicon surface for the best optical coupling into the imager. Thereafter, a color filter and microlens are deposited. See operation 1020.

Furthermore, due to a presence of a p-type implant (which may be included via operation 1006), an effect of interface states resulting from the etching in operation 1019 may be mitigated. Such interface state effect may include the formation of uncompensated interface states that lead to an increase in the dark current and a reduction in photo-conversion efficiency, which are caused by defects and dangling bonds at the silicon surface. For example, the p-type implant (e.g. p+ layer) may hold the silicon surface in equilibrium and electrically passivate the interface states. In addition, a H2 anneal may be performed following the SiN deposition, which may also provide additional passivation of the interface states.

It is only the following claims, including all equivalents, that are intended to define the scope of the various embodiments. Moreover, the embodiments described above are specifically contemplated to be used alone as well as in various combinations. Accordingly, other embodiments, variations, and improvements not described herein are not necessarily excluded.

What is claimed is:
1. An apparatus, comprising:
a first silicon layer having at least one of an associated passivation layer and barrier;

a composite anti-reflection layer including a stack of layers each with a different thickness and refractive index, the composite anti-reflection layer disposed adjacent to the first silicon layer; and a second silicon layer disposed adjacent to the composite anti-reflection layer opposite the first silicon layer;

wherein the first silicon layer, the composite anti-reflection layer, and the second silicon layer are components of a starting material that is adapted for use in the manufacture of an imager;

wherein the apparatus is operable such that imager pixels and circuits are deposited on the first silicon layer using the starting material during the manufacturing of the imager;

wherein the apparatus is operable such that inter-layer dielectrics and metals are deposited on the imager pixels and the circuits during the manufacturing of the imager to generate a structure;

wherein during the manufacturing of the imager, the apparatus is operable such that the structure is deposited on a support substrate and the second silicon layer is etched off, wherein the etching is stopped at the composite anti-reflection layer for depositing a color filter and microlens on the composite anti-reflection layer.

2. The apparatus of claim 1, wherein the apparatus is operable such that the passivation layer is included and is disposed adjacent to the first silicon layer.

3. The apparatus of claim 1, wherein the apparatus is operable such that the barrier is included and is disposed adjacent to the first silicon layer.

4. The apparatus of claim 1, wherein the first silicon layer includes a device silicon layer.

5. The starting material of claim 1, wherein the stack of layers of the composite anti-reflection layer includes alternating layers of at least SiN and $SiO_x$.

6. The starting material of claim 1, wherein the stack of layers of the composite anti-reflection layer includes alternating layers of at least one high refractive index and at least one low refractive index.

7. The apparatus of claim 1, wherein the second silicon layer includes a support silicon layer.

8. The apparatus of claim 1, wherein the apparatus is operable such that a first portion of the composite anti-reflection layer is deposited on the first silicon layer and a second portion of the composite anti-reflection layer is deposited on the second silicon layer, such that the composite anti-reflection layer is formed when the first portion of the composite anti-reflection layer is bonded to the second portion of the composite anti-reflection layer.

9. The apparatus of claim 8, wherein the apparatus is operable such that the second silicon layer is bonded to the first silicon layer via the composite anti-reflection layer.

10. The apparatus of claim 1, wherein the apparatus is operable such that the composite anti-reflection layer is deposited on the first silicon layer after the first silicon layer is bonded to the second silicon layer.

11. The apparatus of claim 10, wherein the apparatus is operable such that the first silicon layer and the second silicon layer are bonded using an oxide layer.

12. The apparatus of claim 11, wherein the apparatus is operable such that the composite anti-reflection layer is deposited on the first silicon layer after etching the oxide layer off of the first silicon layer.

13. The apparatus of claim 1, wherein the composite anti-reflection layer minimizes reflection associated with the first silicon layer.

14. A method, comprising:
providing a first silicon layer having at least one of an associated passivation layer and barrier;

disposing a composite anti-reflection layer adjacent to the first silicon layer, the composite anti-reflection layer including a stack of layers each with a different thickness and refractive index; and disposing a second silicon layer adjacent to the composite anti-reflection layer opposite the first silicon layer;

wherein the first silicon layer, the composite anti-reflection layer, and the second silicon layer are components of a starting material that is adapted for use in the manufacture of an imager;

wherein imager pixels and circuits are deposited on the first silicon layer using the starting material during the manufacturing of the imager;

wherein inter-layer dielectrics and metals are deposited on the imager pixels and the circuits during the manufacturing of the imager to generate a structure;

wherein during the manufacturing of the imager, the structure is deposited on a support substrate and the second silicon layer is etched off, wherein the etching is stopped at the composite anti-reflection layer for depositing a color filter and microlens on the composite anti-reflection layer.

* * * * *